United States Patent
Stevens et al.

(10) Patent No.: US 10,181,704 B2
(45) Date of Patent: Jan. 15, 2019

(54) POWER DISTRIBUTION UNITS WITH RECEPTACLES ON ONE SURFACE AND BRANCH RATED CIRCUIT PROTECTION DEVICES ON AN OPPOSITE SURFACE

(71) Applicant: HEWLETT PACKARD ENTERPRISE DEVELOPMENT LP, Houston, TX (US)

(72) Inventors: Matthew E Stevens, Houston, TX (US); Derrick G Runcie, Houston, TX (US); Darrel G Gaston, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/174,232

(22) Filed: Jun. 6, 2016

(65) Prior Publication Data
US 2017/0353015 A1    Dec. 7, 2017

(51) Int. Cl.
| | |
|---|---|
| H02B 1/20 | (2006.01) |
| H05K 7/18 | (2006.01) |
| H05K 7/14 | (2006.01) |
| H02B 1/04 | (2006.01) |

(52) U.S. Cl.
CPC ............... H02B 1/20 (2013.01); H02B 1/04 (2013.01); H05K 7/14 (2013.01); H05K 7/18 (2013.01)

(58) Field of Classification Search
CPC .. H05K 7/1492; H05K 7/1457; H05K 7/1497; H05K 5/03; H05K 7/1449; H05K 7/1491; H05K 7/1489; H05K 7/1498; H05K 7/18; H02B 1/26; H02B 1/34; H02B 1/52; H02B 3/00; H02B 1/20; H02B 1/04
See application file for complete search history.

(56) References Cited

U.S. PATENT DOCUMENTS

| | | | |
|---|---|---|---|
| 4,952,164 A | 8/1990 | Weber | |
| 5,046,963 A | 9/1991 | Kelly | |
| 5,821,636 A * | 10/1998 | Baker | H02J 3/38 307/64 |

(Continued)

FOREIGN PATENT DOCUMENTS

| | | |
|---|---|---|
| KR | 200243844 Y1 | 10/2001 |
| KR | 200270405 Y1 | 4/2002 |

(Continued)

OTHER PUBLICATIONS

"Lite PDU112IEC PDU Basic 19" 1u 12x C13, 2x C19, 100-240v 16a, Retrieved from Internet Nov. 26, 2015, <http//www.hummingbirdnetworks.com/tripp-lite-pdu12iec-pdu-basic/>.

(Continued)

*Primary Examiner* — Adam B Dravininkas
(74) *Attorney, Agent, or Firm* — Brooks, Cameron & Huebsch, PLLC

(57) ABSTRACT

Examples described herein relate to power distribution units (PDUs) with receptacles on one surface and branch rated circuit protection devices on an opposite surface. For example, a PDU includes a first surface including a plurality of receptacles to couple a plurality of electronic devices to the PDU. The PDU also includes a second surface, opposite the first surface, including a plurality of branch rated circuit protection devices associated with the plurality of receptacles.

16 Claims, 3 Drawing Sheets

(56) References Cited

U.S. PATENT DOCUMENTS

| | | | |
|---|---|---|---|
| 7,979,985 B2 | 7/2011 | Spitaels et al. | |
| 2003/0221817 A1 | 12/2003 | Smith | |
| 2005/0094357 A1* | 5/2005 | Ewing | H01H 85/0241 |
| | | | 361/626 |
| 2005/0259383 A1* | 11/2005 | Ewing | H02B 1/306 |
| | | | 361/622 |
| 2007/0025066 A1* | 2/2007 | Ewing | H01H 85/0241 |
| | | | 361/623 |
| 2008/0093927 A1* | 4/2008 | Ewing | H05K 7/1492 |
| | | | 307/23 |
| 2008/0258026 A1* | 10/2008 | Smith | H02G 3/126 |
| | | | 248/218.4 |
| 2009/0242265 A1* | 10/2009 | Doorhy | H01R 25/006 |
| | | | 174/494 |
| 2012/0014040 A1* | 1/2012 | McGinn | H05K 7/1492 |
| | | | 361/601 |
| 2014/0126116 A1 | 5/2014 | Irons | |

FOREIGN PATENT DOCUMENTS

| | | |
|---|---|---|
| KR | 1020080099055 A | 11/2008 |
| WO | PCT/US2016/012055 | 1/2016 |

OTHER PUBLICATIONS

"Top / Basic Rack Mount PDU / 30A Rackmount PDU / Rack Mount PDU W/ 12×6-20R 20A Outlets (6 Duplex) and 10 Foot L6-30P Twist Lock Power Cord," Retrieved Internet Nov. 26, 2015.
Walther Electrotechnical Systems, 40 pps., Retrieved from Internet Jan. 27, 2016, <http://www.waltherelectric.com/PDFs/PDU_Broschure_r2.pdf>.
International Search Report and Written Opinion, International Application No. PCT/US2016/012055, dated Sep. 30, 2016, pp. 1-9, KIPO.

* cited by examiner

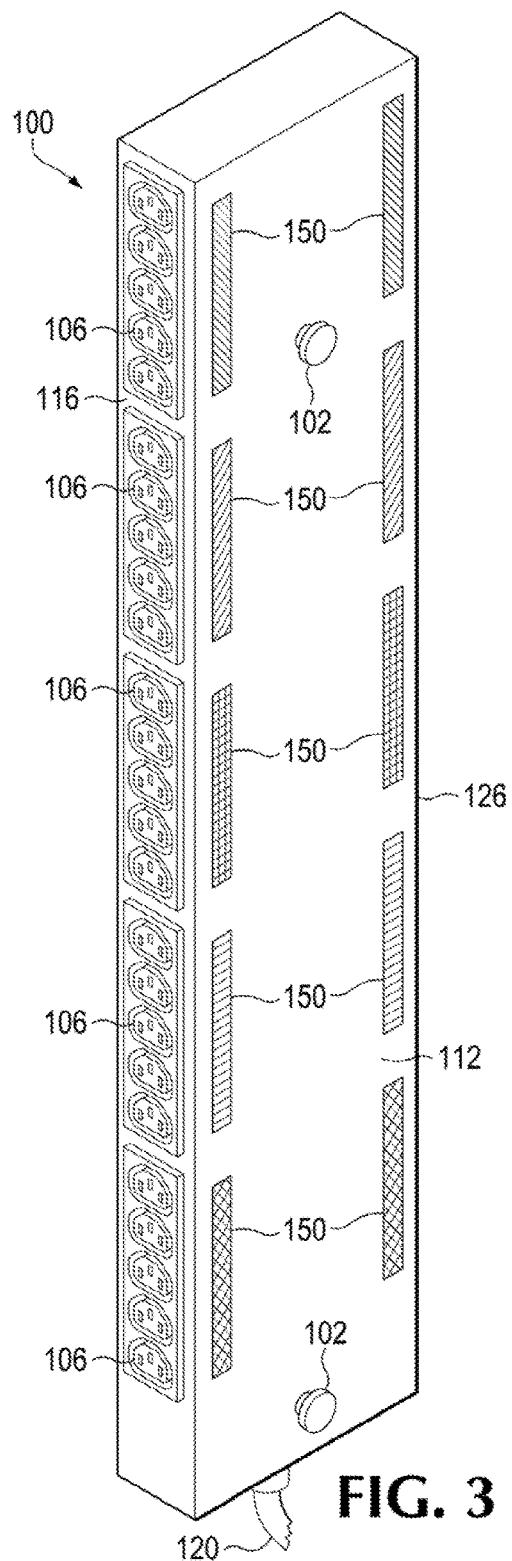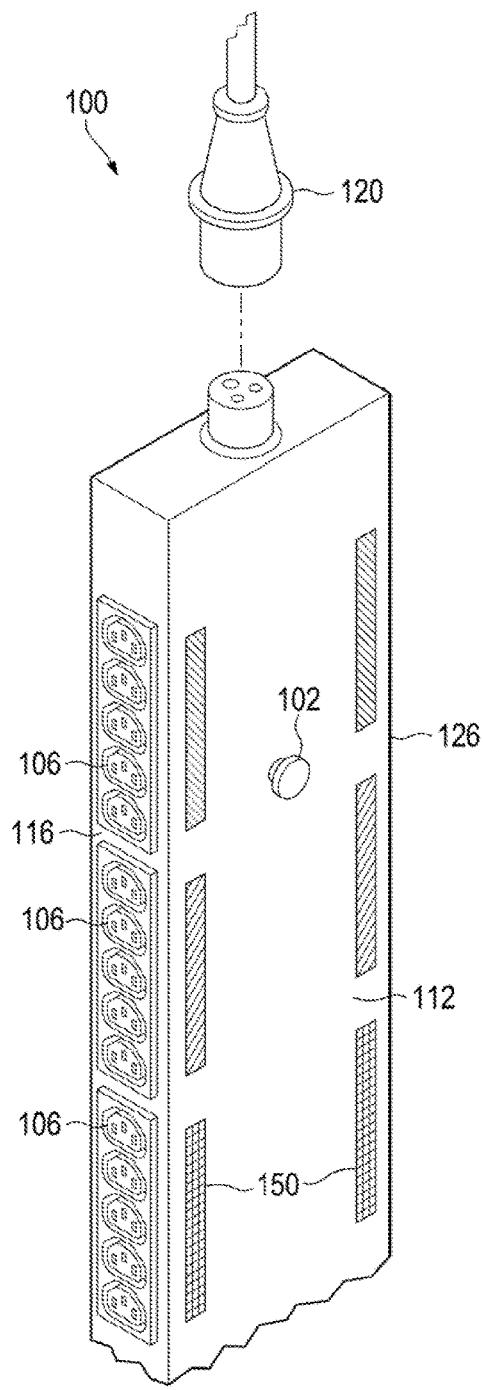

POWER DISTRIBUTION UNITS WITH RECEPTACLES ON ONE SURFACE AND BRANCH RATED CIRCUIT PROTECTION DEVICES ON AN OPPOSITE SURFACE

BACKGROUND

Computing centers such as data centers generally include a large number of electronic devices. The electronic devices can be servers, switches, routers, storage systems, and the like. A rack may provide a standardized structure to support and mount the electronic devices. A power distribution unit (PDU) can also be mounted on the rack to provide electrical power to the electronic devices via a number of power receptacles on a surface of the PDU.

BRIEF DESCRIPTION OF THE DRAWINGS

Some examples of the present application are described with respect to the following figures:

FIG. 3 is a perspective view of the example PDU, including a power cord for the PDU;

FIG. 4 is a perspective view of the example PDU, including a power cord for the PDU.

DETAILED DESCRIPTION

Figure 1:
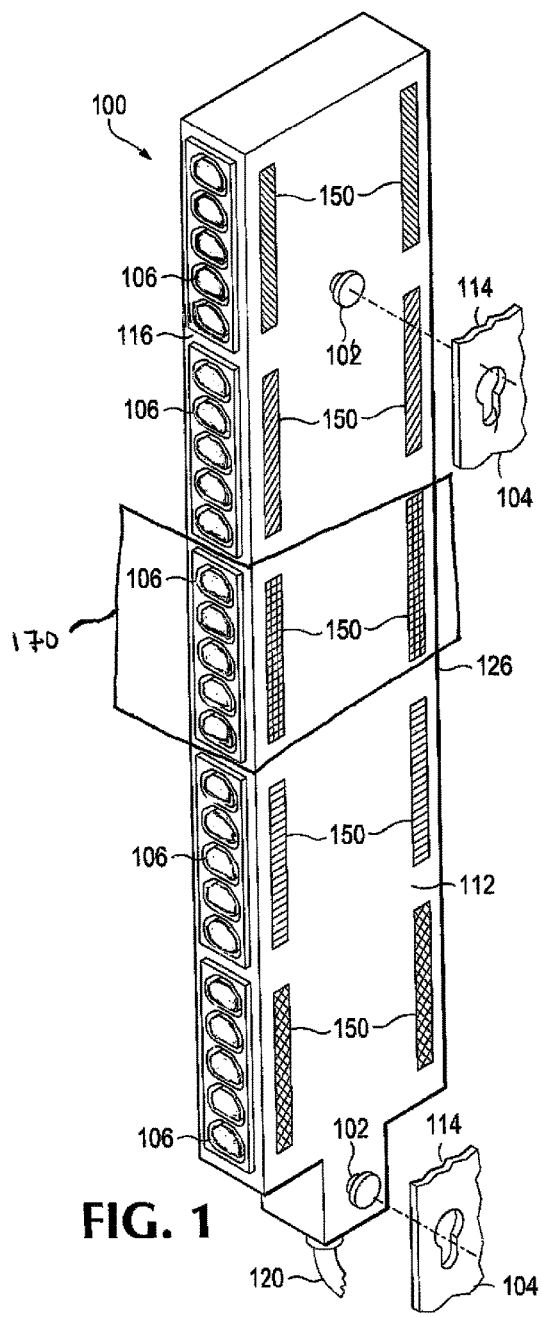
FIG. 1 is a perspective view of an example power distribution unit (PDU), including receptacles on one surface and branch rated circuit protection devices on an opposite surface.

Examples described herein relate to power distribution units (PDUs) with power receptacles on one surface and branch rated circuit protection devices on an opposite surface. A PDU can be rack mounted to provide power to a plurality of rack mount electronic devices (e.g., server devices, networking devices, storage devices, switches, etc.) by coupling the power cords of the electronic devices to the power receptacles (power outlets or power connectors) of the PDU. The PDU can include circuitry and software/firmware to convert alternating current (AC) power to direct current (DC) power for the electronic devices. Further, the PDU can include branch rated circuit protection devices, for the power receptacles, to protect the electronic devices from damages that may be caused by overload or short circuit by interrupting current flow to the electronic devices.

As used herein, a branch rated circuit protection device is a device such as a fuse or circuit breaker that has been evaluated to a safety standard for providing overcurrent protection. Overcurrent (or excess current) is a situation where a larger than intended electric current exists through a conductor, leading to excessive generation of heat, and the risk of fire or damage to equipment. A branch circuit refers to conductors and components following the last overcurrent protective device protecting a load, and a branch circuit protection refers to overcurrent protection with an ampere rating selected to protect the branch circuit. A circuit breaker refers to a device designed to open and close a circuit by non-automatic means, and to open the circuit automatically on a pre-determined overcurrent, without damage to itself when properly applied within its rating. A fuse refers to a type of low resistance resistor that acts as a sacrificial device to provide overcurrent protection, of either the load or source circuit by interrupting an excessive current.

The PDU can be vertically mounted in the rear of the rack to avoid taking space in the rack where the electronic devices can be mounted. An equipment mounted in the rear portion of the rack is referred to as a "zero U (or 0U)," as it takes up no space in the rack. Rack mountable devices are measured in standard heights of 1.75 inches, referred to as "rack unit" or a "U." Thus, a zero U (or 0U) PDU is mounted in the rear of the rack and does not take up space in the rack.

As the demand for increased computing, storage, and networking resources increases, it may be desirable to provide PDUs with high count power receptacles, for example, in high density rack environments. Examples herein provide a vertical 0U PDU with a high receptacle count by placing receptacles on one surface of the PDU (e.g., receptacles facing the rear of the rack) and branch rated circuit protection devices on the opposite surface. The described solution keep the PDU chassis and power cords from protruding into the back of the rack keep out zone (i.e., the serviceability area in the back of the rack), while providing a high receptacle count for high power density rack environments. By moving the branch rated circuit protection devices (e.g., circuit breakers or fuses) to the back side of the PDU, additional space is provided for more receptacles, while maintaining accessibility to the branch rated circuit protection devices when needed.

In one example, a PDU includes a first surface including a plurality of receptacles to couple a plurality of electronic devices to the PDU. The PDU also includes a second surface, opposite the first surface, including a plurality of branch rated circuit protection devices associated with the plurality of receptacles.

In another example, a PDU includes a plurality of power receptacles on a front surface of the PDU to distribute power to a plurality of electronic devices coupled to the PDU. The PDU includes a plurality of branch rated circuit protection devices on a back surface of the PDU, the plurality of branch rated circuit protection devices corresponding to the plurality of power receptacles. The PDU also includes a mounting mechanism on a side surface of the PDU to vertically mount the PDU to a rack enclosure.

In another example, a system includes a rack enclosure including vertical columns and a PDU. The PDU includes a plurality of receptacles on a first surface of the PDU to provide power to a plurality of electronic devices coupled to the PDU. The PDU includes a plurality of branch rated circuit protection devices on a second surface of the PDU opposite the first surface, the branch rated circuit protection devices associated with the plurality of receptacles to protect the plurality of receptacles. The PDU also includes a plurality of mounting pins removably attachable to a side of the PDU to mount the PDU to a vertical column of the rack enclosure.

Referring now to the figures, FIG. 1 is a perspective view of an example power distribution unit (PDU), including receptacles on one surface and branch rated circuit protection devices on an opposite surface. PDU 100 includes a first surface 116 (or front surface or front side) and a second surface 126 (or back surface or back side) opposite the first surface 116. The first surface 116 includes a plurality of receptacles 106 to removably plug in power cords of electronic devices to the PDU 100 such that the PDU 100 can provide power to the electronic devices. Second surface 126 includes a plurality of branch rated circuit protection devices (not shown in FIG. 1). The branch rated circuit devices can be circuit breakers and/or fuses (e.g., removable fuses) to protect load (e.g., electronic devices) coupled to the receptacles 106 of the PDU. The electronic devices can include rack mountable devices such as servers, networking devices, storage devices, etc.

Receptacles 106 can be standard power outlets for receiving standard plugs. For example, in a server rack or data center power system, receptacles 106 can be International Electrotechnical Commission (IEC) standard C19 or C13 outlets configured to receive a standard C14 or C20 plugs. In certain examples, the number of receptacles 106 on the front surface 116 can be at least 48. Receptacles 106 can include a number of sets or groups of receptacles. Each group of receptacles 106 is associated with a branch rated circuit protection device. An association of the group of receptacle 106 to the branch rated circuit protection device (not illustrated in FIG. 1) is represented as 170. Accordingly, a branch rated circuit protection device is aligned to a group of receptacles 106, to provide overcurrent protection to the loads (i.e., electronic devices) coupled to the group of receptacles 106.

In some examples, PDU 100 includes a plurality of visual indicators 150 to align the receptacles 106 to the branch rated circuit protection devices. Visual indicators 150 can include a number of different visual indicators to align a particular group or set of receptacles 106 to a corresponding branch rated circuit protection device. For example, a first pair of visual indicators 150 aligning a first group of receptacles 106 with a first branch rated circuit protection device is different from a second pair of visual indicators 150 aligning a second group of receptacles 106 with a second branch rated circuit protection device. Visual indicators 150 can be color coded and can include strips, light indicators, or any other mechanical and/or electrical means for providing visual indicators.

PDU 100 can also include mounting buttons 102 on a side surface 112 of the PDU 100. The mounting buttons 102 can be on a left surface/side or right surface/side of the PDU 100, depending on the desired position on the rack the PDU 100 is to be mounted. Mounting buttons 102 can be removably inserted into mounting holes (not shown) on the side surface 112 of the PDU 100. Mounting buttons 102 can include any connectors or mounting features to engage with corresponding mounting features 104 on a vertical rack column 114 (or vertical rack surface) of the rack. Each mounting feature 104 can be an opening, recess, or cavity in the vertical rack column 114 to receive the mounting buttons 102. In some examples, mounting feature 104 can include a circular recess and a slot, such that mounting button 102 can be inserted into the circular recess and slid along the slot to secure the mounting button 102 within the mounting feature 104.

PDU 100 can also include a power cord (or terminal block) 120 for providing power to the PDU 100. For example, PDU 100 can be coupled to a main power supply (or to a backup power supply) 300, such as an uninterruptible power supply (UPS), via the power cord 120. As used herein, a terminal block (or terminal board or strip) provides a convenient means of connecting individual electrical wires without a splice or physically joining ends, and may be used to connect wiring among various items of equipment within an enclosure or to make connections among individually enclosed items. Power cord 120 can be located on a top surface or a bottom surface of the PDU 100. In some examples, a width of the PDU 100 may not exceed 52 millimeters (mm). In certain examples, PDU 100 is a basic or standalone PDU. In other examples, PDU 100 is a networked PDU where the PDU is connected to the network via a direct connection to a network switch or indirectly through another PDU.

Figure 2:
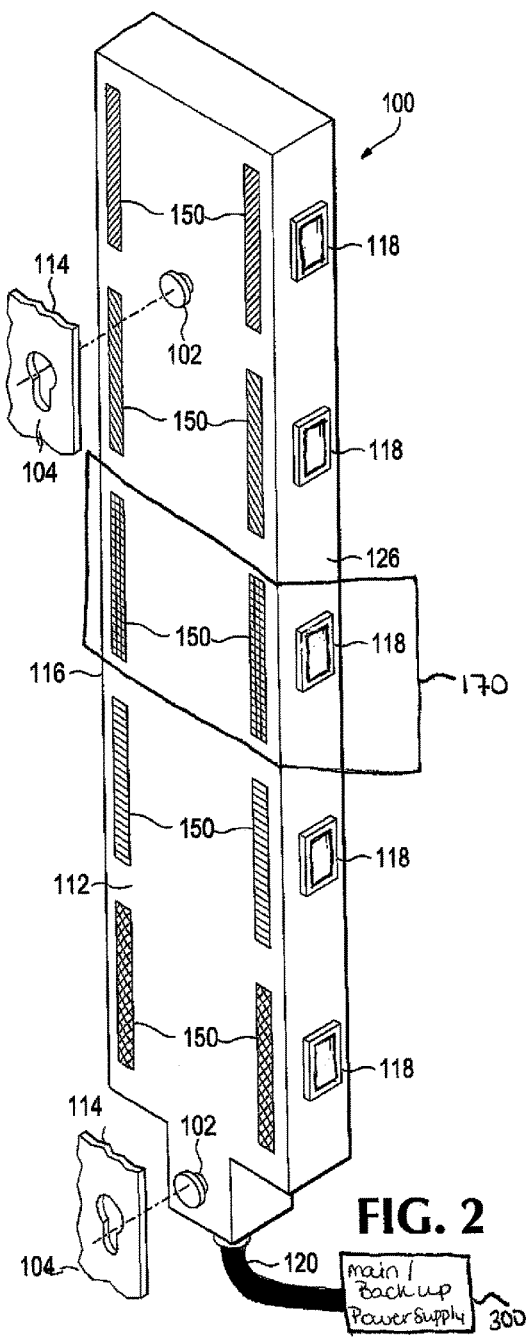
FIG. 2 is a perspective view of an example PDU, including receptacles on one surface and branch rated circuit protection devices on an opposite surface.

FIG. 2 is a perspective view of an example PDU, including receptacles on one surface and branch rated circuit protection devices on an opposite surface. The example of FIG. 2 shows the branch rated circuit protection devices 118 on the second surface 126 (or back surface/side), opposite the first surface 116 (or front surface/side). A branch rated circuit device 118 can be a circuit breaker or a fuse (e.g., a removable fuse) to provide overcurrent protection to the electronic devices plugged into the receptacles 106 of the PDU 100.

PDU 100 includes visual indicators 150 to align the branch rated circuit protection devices 118 to the receptacles 106. For example, a first visual indicator can be placed at or near a first set of receptacles 106 and at or near a first branch rated circuit protection device 118 to indicate (visually) that the first set of receptacles 106 are associated with (i.e., protected by) the first branch rated protection device 118. Similarly, a second visual indicator, different from the first visual indicator, can be placed at or near a second set of receptacles 106 and at or near a second branch rated circuit protection device 118 to indicate that the second set of receptacles 106 are associated with (i.e., protected by) the second branch rated protection device 118. The visual indicators 150 can be placed in close proximity to the corresponding set of receptacles 106 or branch rated circuit protection devices 118. For example, the visual indicators 150 can be placed on the front surface 116, the back surface 126, or the side surfaces 112 of the PDU 100. An association of the group of receptacle (not illustrated in FIG. 2) to the branch rated circuit protection device 118 is represented as 170.

FIG. 3 is a perspective view of the example PDU, including a power cord for the PDU. In the example of FIG. 3, the power cord 120 of the PDU 100 is located on a bottom surface of the PDU 100, where the bottom surface is non-tapering but rather having a flush surface (i.e., relatively flat). As described above, power cord 120 of the PDU 100 can be coupled to a mains power supply such as an AC electric power supply or primary power supply, or a backup (i.e., secondary) power supply (e.g., a UPS). It should be noted that in some examples, PDU 100 can include a terminal block for coupling the PDU 100 to an external power supply.

FIG. 4 is a perspective view of the example PDU, including a power cord for the PDU. In the example of FIG. 4, the power cord 120 of the PDU 100 can be detachable. For example, a cable including a male plug (including connector pins) can be removably attached to a corresponding female connector (including connector holes) on the surface of the PDU 100. Further, in certain examples, the power cord 120 can be attachable at a top surface of the PDU 100. It should be noted that in some examples, PDU 100 can include a terminal block for coupling the PDU 100 to an external power supply.

Figure 5:
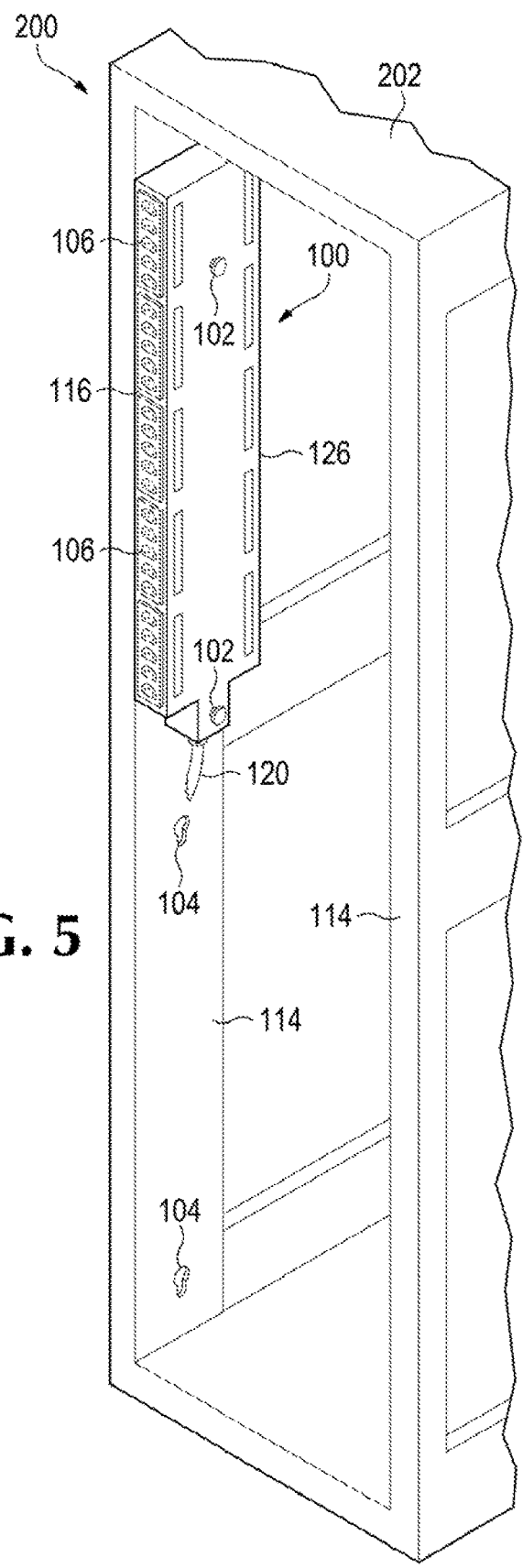
FIG. 5 is a perspective view of the example PDU, mounted on a rack.

FIG. 5 is a perspective view of the example PDU, mounted on a rack. As used herein, a rack is a frame to mount various electronic devices such as servers, switches, routers, storage devices, networking devices, etc. The rack may include rack columns located at the four corners of the rack where openings may operate as rack columns. The insertion of side panels in the openings between the rack columns may convert the rack into a rack enclosure. In the example of FIG. 5, rack enclosure 200 can include a rack 202 and a PDU 100 mounted onto a vertical rack column 114 of the rack 202 via mounting features 104. Mounting features 104 can be an opening, a recess, or a cavity on the vertical rack column 114 of the rack 202. Accordingly, mounting buttons 102 of the PDU 100 can engage with the mounting features 104 to vertically mount the PDU 100 onto the rack 202.

As shown in FIG. 5, the PDU 100 is mounted on the top part of one of the two rear (or back) vertical columns 114 of the rack 202. In other examples, the PDU 100 can be mounted on the top and/or bottom of any of the two rear vertical rack columns 114 of the rack 202. A vertical height of the PDU can be of any size. For example, the PDU can be a 22U (half height), a 42U (full height), a 47U or 48U (taller racks), or any other U height as needed for different depth of racks (e.g., 1075 mm, 1200 mm). PDU 100 includes receptacles 106 on the front surface 116 and branch rated circuit protection devices 118 on the back surface 126 of the PDU 100. The configuration of the PDU 100, as described above, provides a high receptacle count by moving the branch rated circuit protection devices 118 to an opposite side of the receptacles 106, while providing accessibility to the branch rated circuit protection devices 118 and keeping out of the serviceability area of the rack 202.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

What is claimed is:

1. A power distribution unit (PDU), comprising:
   a first surface including a plurality of receptacles to couple a plurality of electronic devices to the PDU;
   a second surface, opposite the first surface, including a plurality of branch rated circuit protection devices aligned with the plurality of receptacles; and
   a mounting mechanism on a side surface of the PDU to vertically mount the PDU on a vertical column of a rack, wherein the plurality of receptacles are to face a back end of the rack.

2. The PDU of claim 1, wherein the branch rated circuit protection devices include a circuit breaker or a removable fuse.

3. The PDU of claim 1, wherein the plurality of receptacles comprise a number of groups of receptacles, wherein each group of receptacles is aligned with a branch rated circuit protection device of the plurality of branch rated circuit devices.

4. The PDU of claim 3, comprising a first visual indicator to represent a first group of receptacles aligned with a first branch rated circuit device and a second visual indicator to represent a second group of receptacles aligned with a second branch rated circuit device, wherein the first visual indicator is different from the second visual indicator.

5. The PDU of claim 1, wherein a width of the PDU is less than or equal to 52 millimeters (mm).

6. The PDU of claim 1, comprising a power cord or a terminal block to couple the PDU to a main power supply or to a backup power supply.

7. The PDU of claim 6, wherein the power cord or terminal block is located at a top surface of the PDU or at a bottom surface of the PDU.

8. The PDU of claim 1, wherein the PDU comprises a zero rack unit (0U) vertical PDU.

9. The PDU of claim 1, wherein the plurality of receptacles comprise International Electrotechnical Commission (IEC) C13 or C19 receptacles.

10. The PDU of claim 1, wherein the plurality of receptacles are on the exterior surface of the first surface and the plurality of branch rated circuit protection devices are on the exterior surface of the second surface.

11. The PDU of claim 1, wherein the second surface further comprises a back surface, and wherein the first surface further comprises a front surface opposite the back surface.

12. A power distribution unit (PDU), comprising:
    a plurality of power receptacles on a front surface of the PDU to distribute power to a plurality of electronic devices coupled to the PDU;
    a plurality of branch rated circuit protection devices on a back surface, opposite the front surface, of the PDU, the plurality of branch rated circuit protection devices aligned with the plurality of power receptacles; and
    a mounting mechanism on a side surface of the PDU to vertically mount the PDU on a vertical column of a rack, wherein the plurality of receptacles are to face a back end of the rack.

13. The PDU of claim 12, wherein a set of power receptacles of the plurality of power receptacles is protected by an aligned branch rated circuit protection device of the plurality of branch rated circuit protection devices.

14. The PDU of claim 12, comprising visual indicators to align a set of power receptacles to an aligned branch rated circuit protection device.

15. A system, comprising:
    a rack enclosure comprising vertical columns; and
    a power distribution unit (PDU), comprising:
      a plurality of receptacles on a first surface of the PDU to provide power to a plurality of electronic devices coupled to the PDU;
      a plurality of branch rated circuit protection devices on a second surface of the PDU opposite the first surface, the branch rated circuit protection devices aligned with the plurality of receptacles to protect the plurality of receptacles; and
      a plurality of mounting pins removably attachable to a side of the PDU to mount the PDU on a vertical column of a rack, wherein the plurality of receptacles are to face a back end of the rack.

16. The system of claim 15, wherein the mounting pins are removably attachable to corresponding plurality of mounting holes on the vertical column of the rack enclosure.

* * * * *